United States Patent [19]

Tanaka et al.

[11] Patent Number: 4,563,241

[45] Date of Patent: Jan. 7, 1986

[54] METHOD OF FORMING PATTERNS

[75] Inventors: Toshihiko Tanaka; Norio Hasegawa; Tetsuya Hayashida, all of Tokyo, Japan

[73] Assignee: Hitachi, Ltd., Tokyo, Japan

[21] Appl. No.: 625,240

[22] Filed: Jun. 27, 1984

[30] Foreign Application Priority Data

Jun. 29, 1983 [JP] Japan ................................ 58-115846
Jun. 29, 1983 [JP] Japan ................................ 58-115847

[51] Int. Cl.[4] .......................... B44C 1/22; C03C 15/00; C03C 25/06; C23F 1/02
[52] U.S. Cl. .................................. 156/643; 156/646; 156/653; 156/656; 156/657; 156/659.1; 156/667; 156/668; 204/192 E; 430/313; 430/317
[58] Field of Search ............... 156/643, 646, 653, 656, 156/657, 659.1, 661.1, 667, 668; 204/164, 192 E; 427/38, 39, 40, 41, 43.1; 430/312, 313, 318, 317

[56] References Cited

U.S. PATENT DOCUMENTS

| | | | |
|---|---|---|---|
| 4,343,677 | 8/1982 | Kinsbron et al. | 204/192 E |
| 4,362,597 | 12/1982 | Fraser et al. | 156/661.1 X |
| 4,454,221 | 6/1984 | Chen et al. | 430/316 |

*Primary Examiner*—William A. Powell
*Attorney, Agent, or Firm*—Antonelli, Terry & Wands

[57] ABSTRACT

After a bottom layer film, an intermediate film and a top layer film were laminated and formed on a film which is processed and which was formed on a substrate having a different level portion, the patterns of the top layer film are sequentially transferred to the intermediate film, bottom layer film and film to be processed, thereby forming the patterns of the film to be processed. By minimizing the differences among the light refractive index of the intermediate film and the light refractive indexes of the bottom and top layer films, the patterns can be formed with a far higher degree of accuracy than that by the conventional multi layer resist method.

20 Claims, 8 Drawing Figures

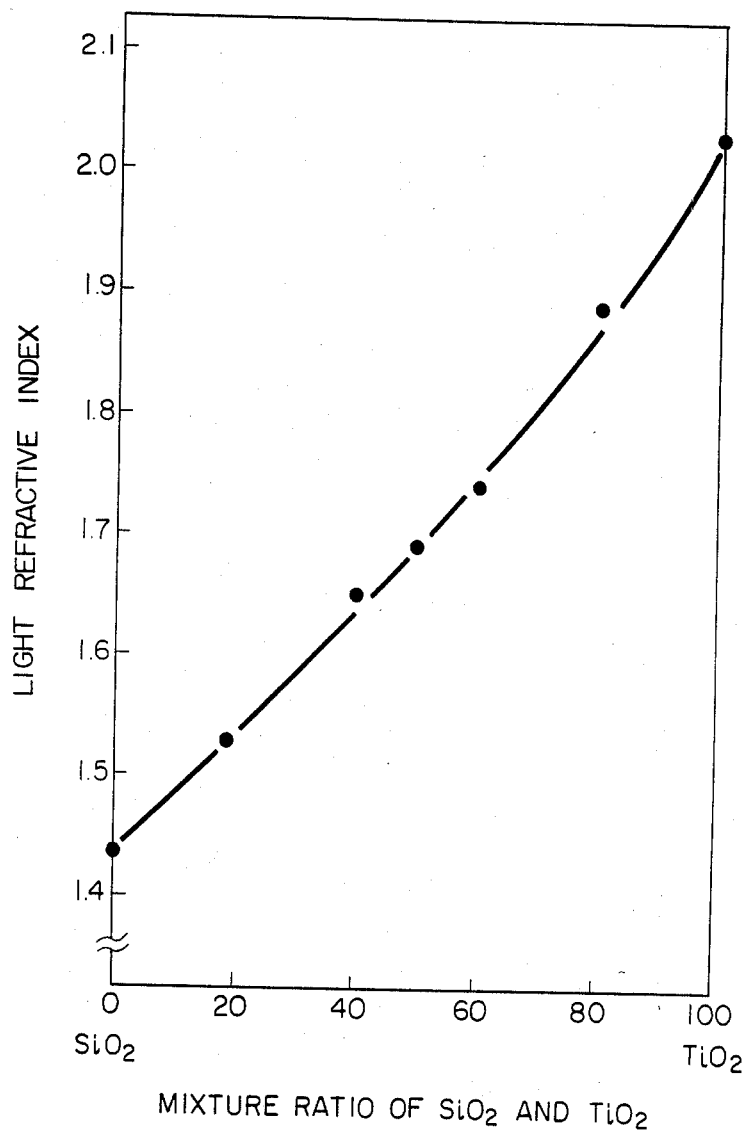

METHOD OF FORMING PATTERNS

BACKGROUND OF THE INVENTION

The present invention relates to a method of forming patterns and, more particularly, to a pattern forming method which is particularly useful to form micropatterns for a semiconductor integrated circuit or a magnetic bubble memory device which has a high integration density.

As is well known, the integration density of a semiconductor integrated circuit or a magnetic bubble memory device in recent years is remarkably increasing, so that the significance of the technology to accurately form various patterns having extremely fine dimensions is increasing more and more.

Various patterns of the semiconductor device and magnetic bubble memory device are formed by the method called photolithography as is well known.

This method is performed in the manner as follows. Namely, a film (photo resist film) whose solubility is varied due to irradiation of the light or X-rays (these radiations are simply written as the light as a general term in this specification) is formed on a film such as an insulation film or conductive film or the like where patterns should be formed. After the light was selectively radiated onto a desired portion of this photo resist film, it is developed to remove the portion having large solubility and the photo resist film pattern is formed. The exposed portions of the film where the above-mentioned patterns should be formed are removed by etching, thereby forming various patterns such as wirings and electrodes, etc.

This photolithography is widely used to manufacture various types of semiconductor devices and magnetic bubble memory devices since the micropatterns can be accurately formed. However, when unevenness exist on the substrate under the insulation film and conductive material film, a degree of accuracy upon formation of the patterns remarkably decreases, so that there is a large problem such that it is difficult to accurately form the micropatterns.

The first cause for such an undesirable problem is that the shape of the photo resist pattern becomes inaccurate due to the phenomenon of halation such that the incident light into the photo resist film is reflected by the slant surface at the stepped portions of the substrate and even the portions to which the light should not be inherently radiated are radiated by the above-mentioned reflected light, so that the solubility would have been changed.

Also, the second cause is the phenomenon called the interference effect such that since there is a remarkable difference in thickness in the stepped portions of the photo resist films, a degree of accuracy in formation of the patterns will have been reduced due to the interference by the incident light and the reflected light in the film.

To solve such problems caused due to the uneven portions or different-level portions of the surface of the substrate, a method called "Multi Layer Resist Method" has been generally proposed in the Japanese Patent Application Laid-open No. 107775/76.

According to this method, in the case where the uneven portions or different-level portions exist on the substrate, a thick organic material layer (bottom layer film) is first formed by coating on the film which is processed to make the surface thereof flat, and thereafter a thin film (intermediate film) of SOG (Spin On Glass), PSG (Phosphosilicate Glass), $SiO_2$, or the like and a thin photo resist film (top layer film) are further formed and laminated thereon.

Subsequently, by the ordinary photolithography technology, the exposure onto the top layer film, development and etching of the intermediate film are performed, thereby processing the intermediate film into a desired shape. Thereafter, the exposed portions of the thick bottom layer film are removed by dry etching using the resulting pattern consisting of the intermediate film as a mask. The exposed portions of the film which is processed are removed by etching, thereby forming a desired pattern.

Although the processing steps of this method are more complicated than the conventional method which uses only the photo resist film of the single layer, the surface of the film is made flat by the presence of the thick bottom layer film and the thin photo resist film is formed thereon, so as to prevent the above-mentioned interference effect in the photo resist film. Further, the light reflected from the different-level portions is absorbed by the bottom layer film and/or intermediate film and doesn't reach the photo resist film (top layer film), so that the influence due to the above-mentioned halation is also prevented.

Thus, even in the case where the uneven portions exist on the surface of the substrate, the wirings and electrodes and other various micropatterns can be formed with high degree of accuracy.

However, in the conventional multi layer resist method, the characteristics of the bottom layer film, intermediate film and top layer film are not sufficiently examined; therefore, the feature of the multi layer resist method is not so perfectly utilized and this results in insufficient accuracy upon formation of the patterns.

With a further increasing integration density of the semiconductor integrated circuit, it is necessary to further highly accurately form further fine patterns and it is strongly desired to further raise a degree of accuracy in the multi layer resist method.

SUMMARY OF THE INVENTION

It is an object of the present invention to solve the above-described conventional problems and to provide a method of forming patterns whereby even when uneven portions exist on the surface of the substrate, various micropatterns can be formed with an extremely high degree of accuracy.

Another object of the invention is to provide a pattern forming method whereby the pattern forming accuracy in the multi layer resist method can be further improved and semiconductor integrated circuits or magnetic bubble memory devices which have a high integration density can be manufactured with high yield.

To accomplish the above objects, according to the present invention, the differences among the light refractive index of the intermediate film and those of the top layer film and bottom layer film in the multi layer resist method are made small, thereby reducing the light reflection at each interface between the top layer film and the intermediate film and between the intermediate film and the bottom layer film respectively, and thereby preventing the interference effect caused due to the difference in film thickness in the top layer film. In this way, the variation in dimensions upon formation of the patterns is suppressed, thereby improving a degree of accuracy in formation of the patterns.

BRIEF DESCRIPTION OF THE DRAWINGS

FIGS. 2 to 5 are graphs to explain different embodiments of the present invention, respectively.

DESCRIPTION OF THE PREFERRED EMBODIMENTS

Figure 1A:
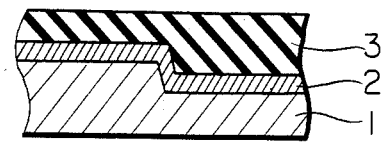
Figs. 1a to 1d are processing step diagrams in one embodiment of the present invention.

As described above, according to the multi layer resist method, the bottom layer film consisting of the thick organic material film formed by coating on the film which is processed to form the flat surface, and a mask pattern consisting of a thin inorganic material film is formed on this flat surface by the ordinary photo etching technology. Thereafter, the exposed portions of the bottom layer film are removed by anisotropic etching such as, for instance, reactive sputter-etching, and the film to be processed of these portions exposed by etching is etched, thereby forming the patterns.

To form the patterns with good accuracy, it is obviously necessary to form the mask pattern consisting of the intermediate film with high degree of accuracy. For this purpose, in the above-mentioned photo etching step, it is necessary to absorb the light reflected from the surface of the film which is processed at the different-level portions and the like in the bottom layer film and intermediate film and thereby to prevent the reflected light from reaching the top layer film as the photo resist film.

However, since the intermediate film is used as the mask for etching the thick bottom layer film as described above, it is required that the intermediate film has enough resistance against the anisotropic etching such as the reactive sputter-etching or the like. In the conventional intermediate film, only the dry etching resisting property is seriously considered, but the consideration was not made with respect to the light absorption.

On the other hand, in the conventional multi layer resist method, only the reduction of the light reflected from the surface of the film which is processed by increasing the light absorption by the bottom layer film is seriously considered, and it was thought that the larger light extinction coefficient of the bottom layer film is more preferably.

However, according to the examination by the present inventors, an excessive large light extinction coefficient of the bottom layer film causes the amount of light reflected from the surface of the bottom layer film to be increased, so that the sum of the reflection light from the surface of the layer to be processed which passes through the bottom layer film and the light reflected by the surface of the bottom layer film contrarily increases. Thus, it has been found that the accuracy of dimensions of the resulting patterns would have been reduced.

In addition, it has been found that not only the reflection light from the surface of the bottom layer film but also the reflection light from the surface of the intermediate film becomes a cause of reduction of the accuracy of dimensions of the patterns. Namely, to further improve the accuracy in formation of the patterns in the multi layer resist method, even if the bottom layer film is merely formed of material having a large light extinction coefficient, it will be insufficient; it is finally necessary to reduce the amount of light reflected from the surfaces of both bottom layer film and intermediate film. It has been found that it is effective to reduce the differences in light refractive index among the intermediate layer and the top layer film and bottom layer film for that purpose.

If the differences in light refractive index among the intermediate layer and the bottom layer film and top layer film are less than 12%, the excellent accuracy of less than ±0.03 μm will be obtained which is better than the accuracy of ±0.04 μm by the conventional multi layer resist method. In particular, it has been confirmed that if the difference is less than 5%, the patterns can be formed with an extremely high degree of dimensional accuracy of ±0.01 μm.

EXAMPLE 1

As shown in FIG. 1a, an Al film 2 as a film which is to be processed was formed on a substrate 1 having the different level portion on the surface thereof, and a photo resist AZ1350J (made by Shipley Co., Ltd., a trade name) was further coated thereon to form a bottom layer film 3 with the flat surface in which a thickness of the thick portion is about 2 μm. Thereafter, it was subjected to the heat treatment at 300° C. for 30 minutes. Although the light extinction coefficient of the bottom layer film became about 0.1 due to this heat treatment, the light refractive index was not changed and was about 1.68.

Figure 1B:
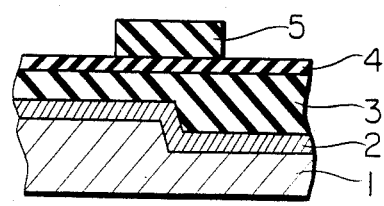

Next, as shown in FIG. 1b, an intermediate film 4 having a thickness of 0.1 μm was formed. This intermediate film 4 was formed in the manner such that after OCK (available from Tokyo Ohka Co., Ltd., a trade name, material of which $Si(OH)_4$ was dissolved in ethyl alcohol) containing five weight percent of Oil Yellow (a trade name, yellow dye) was coated by the spin coating so as to have a thickness of ±0.1 μm, it was subjected to the heat treatment at 200° C. for 30 minutes. The light refractive index of the intermediate film 4 formed in this way was about 1.68 which is equal to that of the bottom layer film 3.

A photo resist (AZ1350J; made by Shipley Co., Ltd., a trade name) was coated on the intermediate film 4 to form an top layer film having a thickness of 0.6 μm and the light refractive index of about 1.68. Thereafter, the unnecessary portions were removed by the well known exposure and development processings, thereby forming a photo resist pattern 5.

Figure 1C:
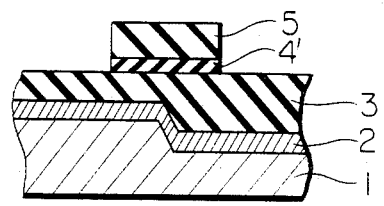
Figure 1D:
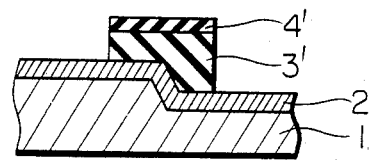

As shown in Fig. 1c, the exposed portions of the intermediate film 4 were removed by etching by use of the photo resist pattern 5 as the mask. If this device is then processed by the reactive sputter-etching using oxygen plasma, it will have been rapidly removed since the film thickness of the photo resist pattern 5 is far thinner than that of the bottom layer film 3. Therefore, the exposed portions of the bottom layer film 3 were removed by etching substantially using an intermediate film 4' as the mask. As a result, as shown in FIG. 1d, a bottom layer film 3' of the portion which is covered by the intermediate film 4' remained and the other portions were etched, so that a portion of the Al film 2 was exposed. This exposed portion was removed by a well known method and the patterns such as the electrodes and wirings and the like consisting of Al were formed.

In this example, as mentioned above, the bottom layer film, intermediate film and top layer film whose light refractive indexes are all about 1.68 were used. Therefore, it is possible to prevent the light reflection at each boundary surface between the top layer film and the intermediate film and between the intermediate film and the bottom layer film and the foregoing interference effect caused due to the difference in film thickness at the partial portions in the intermediate film. Consequently, in spite of the fact that the large different level portion exists on the surface of the Si substrate, the photo resist pattern could be formed with a high degree of dimensional accuracy over about ±0.01 μm.

The dimensional accuracy of the photo resist pattern which is obtained by the conventional multi layer z resist method is about ±0.04 μm, so that it has been confirmed that the present invention is extremely effective.

EXAMPLE 2

In the above Example 1, the light refractive index of the intermediate layer was set at about 1.68 and the light refractive index of the intermediate film was made substantially coincident with those of the top and bottom layer films.

However, even if the light refractive index of the intermediate film is not identical to the light refractive indexes of the top and bottom layer films, when the differences among them are set to less than 5%, it has been found that the photo resist pattern can be formed with high degree of dimensional accuracy of about less than ±0.01 μm.

For example, in the case where the light refractive indexes of the upper and lower layer films are both about 1.68, if the light refractive index of the intermediate film lies within a range of about 1.60 to 1.75, the high dimensional accuracy of about ±0.01 μm or better can be derived.

When the differences in light refractive index among them are larger than 5%, the dimensional accuracy of the photo resist pattern was reduced; however, if they are smaller than 12%, the high accuracy of less than ±0.03 μm can be obtained which is better than the accuracy of ±0.04 μm by the conventional multi layer resist method.

In addition, the case where the light refractive indexes of the top and bottom layer films are equal has been shown in the above embodiment, but the present invention is not limited to such a case. Even when the light refractive indexes of the top and bottom layer films differ, if the differences in refractive index among the intermediate film and those top and bottom layer films are respectively less than about 5%, the photo resist pattern can be formed similarly with high degree of dimensional accuracy.

EXAMPLE 3

Although the light refractive index of the intermediate film has been adjusted into a desired value using yellow dye in the above Example, a desired refractive index can be also obtained using many other materials than the yellow dye.

For example, many thin films consisting of various oxides were formed and the respective light refractive indexes were measured. The results are shown in Table 1. It will be appreciated that the intermediate films having various light refractive indexes can be easily formed.

TABLE 1

| Metal oxide | Starting material | Refractive index |
| --- | --- | --- |
| $Al_2O_3$ | $Al(NO_3)_3 \cdot 9H_2O$ | 1.62 |
| | Al—sec-butylate | |
| $CeO_2$ | $Ce(NO_3)_3 \cdot 6H_2O$ | 2.11 |
| $HfO_2$ | $HfOCl_2 \cdot 8H_2O$ | 2.04 |
| $In_2O_3$ | $In(NO_3)_3$ | 1.95 |
| $La_2O_3$ | $La(NO_3)_3$ | 1.78 |
| $Sb_2O_4$ | $SbCl_5$ | 1.90 |
| $SiO_2$ | $Si(OR)_4$ | 1.46 |
| $Ta_2O_5$ | $TaCl_5$ | 2.1 |
| $ThO_2$ | $ThCl_4, Th(NO_3)_4$ | 1.93 |
| $TiO_2$ | $TiCl_4, Ti(OR)_4$ | ~2.3 |
| $Y_2O_3$ | $Y(NO_3)_3$ | 1.82 |
| $ZrO_2$ | $ZrOCl_2$ | 1.72 |
| $SnO_2$ | $SnCl_4$ | 1.87 |

A desired light refractive index can be derived by use of a mixture consisting of a plurality of kinds of these oxides.

For instance, FIG. 2 shows the relation between the mixture ratio and the light refractive index with respect to the films which were formed of mixtures having various mixture ratios of $SiO_2$ and $TiO_2$.

As is obvious from FIG. 2, since the light refractive index can be adjusted in a range from approximately 1.44 to 2.02 by use of the films containing $SiO_2$ and $TiO_2$, it is possible to select many materials as the bottom layer film and top layer film. In addition, since the intermediate film is used as the mask upon etching of the bottom layer film, it is obviously necessary that the intermediate film is formed of material having a higher dry etching resisting property than the bottom layer film.

EXAMPLE 4

Figure 3:
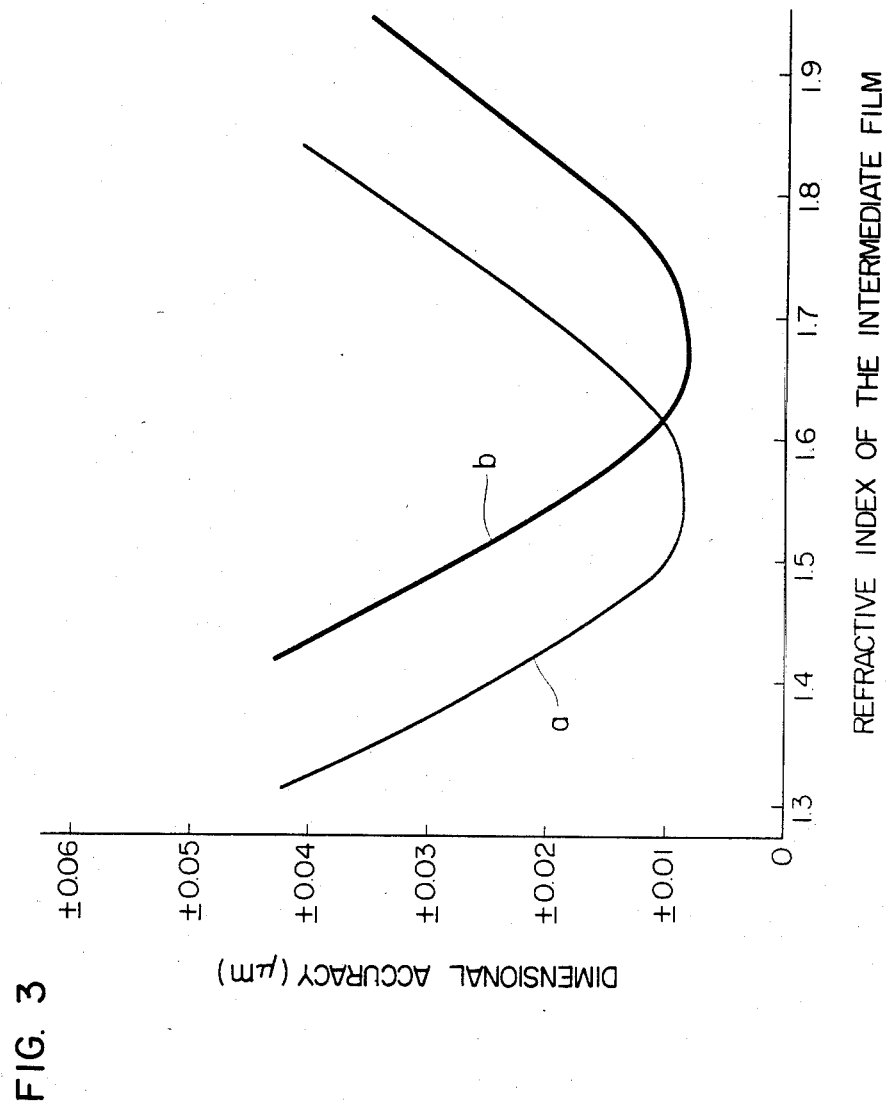

The light refractive index of the intermediate film can be set at a desired value in a wide range as mentioned above. FIG. 3 shows the relation between the light refractive index of the intermediate film and the dimensional accuracy of the photo resist pattern obtained.

In FIG. 3, the curve a indicates the case where the light refractive indexes of both bottom and top layer films were set at 1.55, while the curve b represents the case where the light refractive indexes of both top and bottom layer films were set at 1.68, respectively.

As is obvious from FIG. 3, according to the invention, a higher degree of accuracy than the conventional dimensional accuracy of ±0.04 μm is derived in a wide range, and it has been admitted that when the differences in refractive index among the intermediate film and the top and bottom layer films are set to less than 12%, the excellent accuracy of a value of less than ±0.03 μm which is better than that by the conventional multi layer resist method can be derived. Particularly, when the differences in refractive index are set to less than 5%, the extremely preferable result of better than ±0.01 μm was obtained.

EXAMPLE 5

Figure 4:
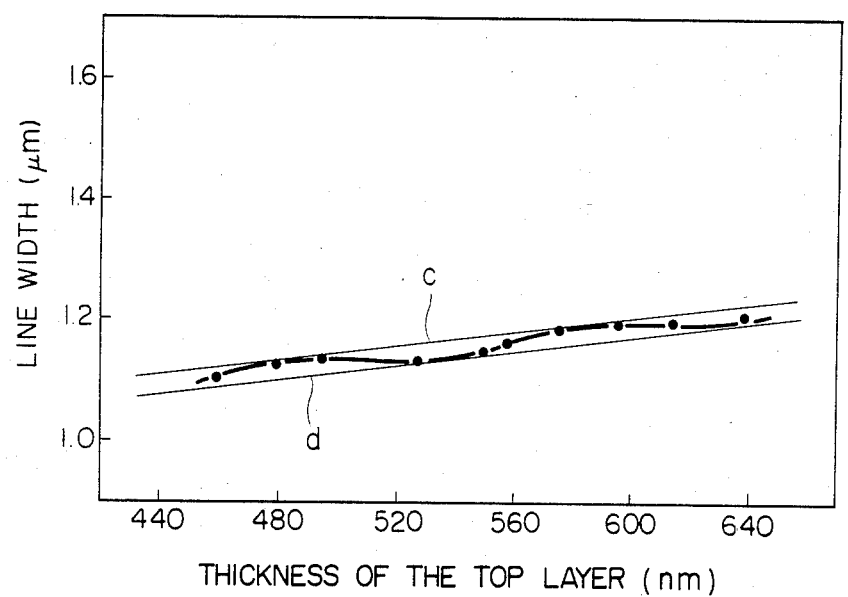

FIG. 4 shows an example of the relation between the line width of the photo resist pattern and the thickness of the upper layer film when the photo resist patterns were formed using the masks of the same dimensions according to the invention.

As is obvious from FIG. 4, in this invention, even when the thickness of the top layer film was varied by 40 nm, the variation in line width of the resulting photo resist pattern is merely of the order of approximately 0.01 μm.

In addition, each measurement value lies within two straight lines c and d and it has been confirmed that the variation in measurement value is less than about 0.01 μm.

EXAMPLE 6

As mentioned above, in the conventional multi layer resist method, it has been thought that it is more preferable for the bottom layer film to have a larger light extinction coefficient.

However, according to the examination by the present inventors, it has been found that an excessively large light extinction coefficient of the bottom layer film causes the amount of reflection light at the boundary surface between the intermediate film and the bottom layer film to be increased and causes the accuracy in formation of the patterns to be reduced.

Figure 5:
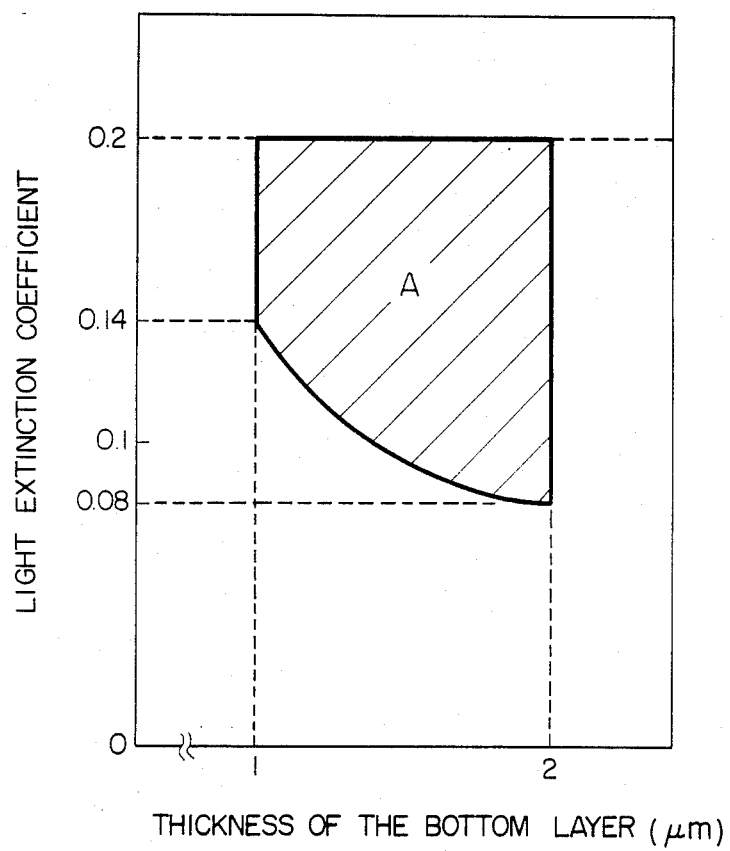

FIG. 5 shows an example of the range of light extinction coefficient of the bottom layer film in which a preferable result is obtained when the thickness (the film thickness at the thinnest portion) of the bottom layer film was set to 1–2 μm.

It has been admitted that when the thickness and light extinction coefficient of the bottom layer film are within a hatched region A of FIG. 5, the accuracy of less than ±0.02 μm which is far better than the dimensional accuracy of ±0.04 μm by the conventional multi layer resist method can be derived.

As mentioned above, in the present invention, various metal oxides can be used as the intermediate film. The intermediate film may be formed by adding such oxides into SOG (Spin On Glass) or the like.

As the top layer film, it is possible to widely use a well known photo resist such as, for instance, a photo resist of the phenol novolak system such as OFPR800, ONPR830 (trade names, available from Tokyo Ohka Co., Ltd.), HPR204 (a trade name, available from Hunt Co., Ltd.), etc., a resist of the polyvinyl phenol system such as RD200N, RU1000N (trade names, available from Hitachi Chemical Co., Ltd.), etc., a photo resist of the cyclorubber system such as KTFR (a trade name, available from Kodak Co., Ltd.), CBR (a trade name, available from Japan Synthetic Rubber Co., Ltd.), etc., and the like, in addition to the above-mentioned AZ1350J.

On the other hand, the bottom layer film is not limited to only the above-mentioned various photo resists, but it is possible to use various organic high molecular weight compounds such as, for example, polyimide resin and the like. The light refractive index and light extinction coefficient can be adjusted into desired values by adding the fine powder such as dye, metal oxides, or graphite, or the like into those compounds.

Although as the thickness of the top layer film is thinner, the dimensional accuracy of the patterns becomes better, an excessively thin film causes undesirable obstacles such as the occurrence of pin hole and the like. Therefore, it is preferable to set the thickness of the top layer film at about 0.3–1 μm for this reason.

The intermediate film having a very thin thickness cannot be used as the mask for dry etching the bottom film, but if the thickness thereof is too thick, it is difficult to accurately form the mask pattern consisting of the intermediate film. Therefore, it is desirable to set the thickness of the intermediate film at about 500–2000 Å.

In the case where the thickness of the bottom layer film has a value which is equal to at least the depth of the different level portion, the surface of the bottom layer film can be made flat. However, if the thickness of the bottom layer film at the top portion of the different level portion is set to larger than about 0.6 μm, the light reflection at the boundary surface between the bottom layer film and the film which is processed can be effectively prevented and a further preferable result is obtained.

However, if the thickness of the bottom layer film at the bottom portion of the different level portion is too thick, it will take a long time for patterning of the bottom layer film and also the etching of the film which is processed will become difficult. Thus, it is undesirable to set the thickness thereof to more than about 3 μm.

As is obvious from the above description, according to the present invention, the remarkable improvement in accuracy by the multi layer resist method is extremely useful for manufacturing semiconductor integrated circuits or magnetic bubble memory devices with extremely high integration density.

We claim:

1. A method of forming patterns comprising the steps of:
   sequentially laminating and forming, on a film to be processed which is formed, on a surface of a substrate, a bottom layer film substantially made of an organic high molecular weight compound, an intermediate film having a dry etching resisting property larger than that of said bottom layer film, and a top layer film having photosensitivity;
   selectively radiating the light onto desired portions of said top layer film and thereafter developing it, thereby forming a pattern of the top layer film having a desired shape;
   removing the exposed portions of said intermediate film;
   removing the exposed portions of said bottom layer film; and
   removing the exposed portions of said film to be processed,
   wherein each difference between the light refractive index of said intermediate film, the light refractive index of said top layer film and the light refractive index of said bottom layer film is not larger than 12%.

2. A method according to claim 1, wherein said each difference in refractive index is not larger than 5%.

3. A method according to claim 1, wherein the surface of said substrate has a different level portion.

4. A method according to claim 1, wherein said top layer film is a photo resist film.

5. A method according to claim 1, wherein said intermediate film is a film made of metal oxide.

6. A method according to claim 5, wherein said metal oxide is at least one kind selected from a group consisting of $Al_2O_3$, $CeO_2$, $HfO_2$, $In_2O_3$, $La_2O_3$, $Sb_2O_4$, $SiO_2$, $Ta_2O_5$, $ThO_2$, $TiO_2$, $Y_2O_3$, $ZrO_2$, and $SnO_2$.

7. A method according to claim 1, wherein said intermediate film contains dye.

8. A method according to claim 1, wherein said bottom layer film is a photo resist film.

9. A method according to claim 1, wherein said bottom layer film is a resin film.

10. A method according to claim 1, wherein the exposed portions of said bottom layer film are removed by dry etching.

11. A method according to claim 10, wherein said dry etching is a reactive sputter-etching.

12. A method according to claim 1, wherein the thickness and light extinction coefficient of said bottom layer film are within an area A of FIG. 5 to thereby achieve an accuracy of better than $\pm 0.2$ $\mu$m.

13. A method according to claim 11, wherein the thickness of said top layer film is 0.3 to 1 $\mu$m.

14. A method according to claim 1, wherein the thickness of said intermediate film is 500–2000 Å.

15. A method according to claim 3, wherein the thickness at said high different level portion of said bottom layer film is not smaller than 0.6 $\mu$m and the thickness at the low different level portion thereof is not larger than 3 $\mu$m.

16. A method according to claim 1, wherein the light refractive indexes of said top and bottom layer films are equal to each other.

17. A method according to claim 1, wherein the light refractive indexes of said top and bottom layer films are different from each other.

18. A method according to claim 5, wherein said intermediate film is formed of spin-on-glass containing metal oxide.

19. A method according to claim 1, wherein said bottom layer film contains at least one of dye, fine powder of metal oxide and fine powder of graphite.

20. A method according to claim 1, wherein the thickness (x, in $\mu$m) of the bottom layer and the light extinction coefficient (y) of the bottom layer, in the coordinate system (x, y), are in the enclosed area surrounded by four lines connecting points of (1, 0.14), (1, 0.2), (2, 0.2), (2, 0.08), and (1, 0.14), in this order, and wherein the line between (2, 0.08) and (1, 0.14) is outwardly convex, in the direction of less light extinction coefficient, to thereby achieve an accuracy of better than $\pm 0.2$ $\mu$m.

* * * * *